(12) United States Patent
Rogers et al.

(10) Patent No.: US 6,939,146 B2
(45) Date of Patent: Sep. 6, 2005

(54) BOARD-TO-BOARD POWER CONNECTOR FOR A PROJECTION DEVICE

(75) Inventors: Tony Rogers, Milwaukie, OR (US); Clark Wilson, Clackamas, OR (US)

(73) Assignee: InFocus Corporation, Wilsonville, OR (US)

( * ) Notice: Subject to any disclaimer, the term of this patent is extended or adjusted under 35 U.S.C. 154(b) by 0 days.

(21) Appl. No.: 10/860,558

(22) Filed: Jun. 2, 2004

(65) Prior Publication Data

US 2004/0266228 A1 Dec. 30, 2004

Related U.S. Application Data

(60) Provisional application No. 60/475,568, filed on Jun. 2, 2003.

(51) Int. Cl.[7] ............................ H01R 12/00; H05K 1/00
(52) U.S. Cl. .......................................... 439/74; 353/119
(58) Field of Search ............................ 353/119, 60, 59; 439/74

(56) References Cited

U.S. PATENT DOCUMENTS

| | | | | |
|---|---|---|---|---|
| 5,743,610 A | * | 4/1998 | Yajima et al. | 353/31 |
| 6,402,324 B1 | * | 6/2002 | Kuroda et al. | 353/52 |
| 6,457,980 B2 | * | 10/2002 | Hattori et al. | 439/74 |
| 6,769,922 B1 | * | 8/2004 | Lee et al. | 439/74 |
| 6,793,343 B2 | * | 9/2004 | Nakano et al. | 353/61 |

* cited by examiner

*Primary Examiner*—Hae Moon Hyeon
(74) *Attorney, Agent, or Firm*—Alleman Hall McCoy Russell & Tuttle LLP

(57) ABSTRACT

A projection device is disclosed, wherein the projection device includes a first circuit board, a second circuit board positioned in a spaced-apart relation to the first circuit board, a first connector extending from the first circuit board generally linearly toward the second circuit board, and a second connector extending from the second circuit board generally linearly toward the first circuit board, wherein the first connector and the second connector are coupled together to form an electrically conductive pathway between the first circuit board and the second circuit board.

24 Claims, 4 Drawing Sheets

BOARD-TO-BOARD POWER CONNECTOR FOR A PROJECTION DEVICE

CROSS-REFERENCE TO RELATED APPLICATIONS

The present application claims priority under 35 U.S.C. § 119 to U.S. Provisional Patent Application Ser. No. 60/475,568, which was filed on Jun. 2, 2003. The disclosure of that application is hereby incorporated by reference in its entirety for all purposes.

TECHNICAL FIELD

The present invention relates generally to the electrical connection of one circuit board to another circuit board in a projection device.

BRIEF DESCRIPTION OF THE DRAWINGS

The disclosure is illustrated by way of example and not by way of limitation in the figures of the accompanying drawings, in which the like references indicate similar elements and in which.

DETAILED DESCRIPTION

Figure 1:
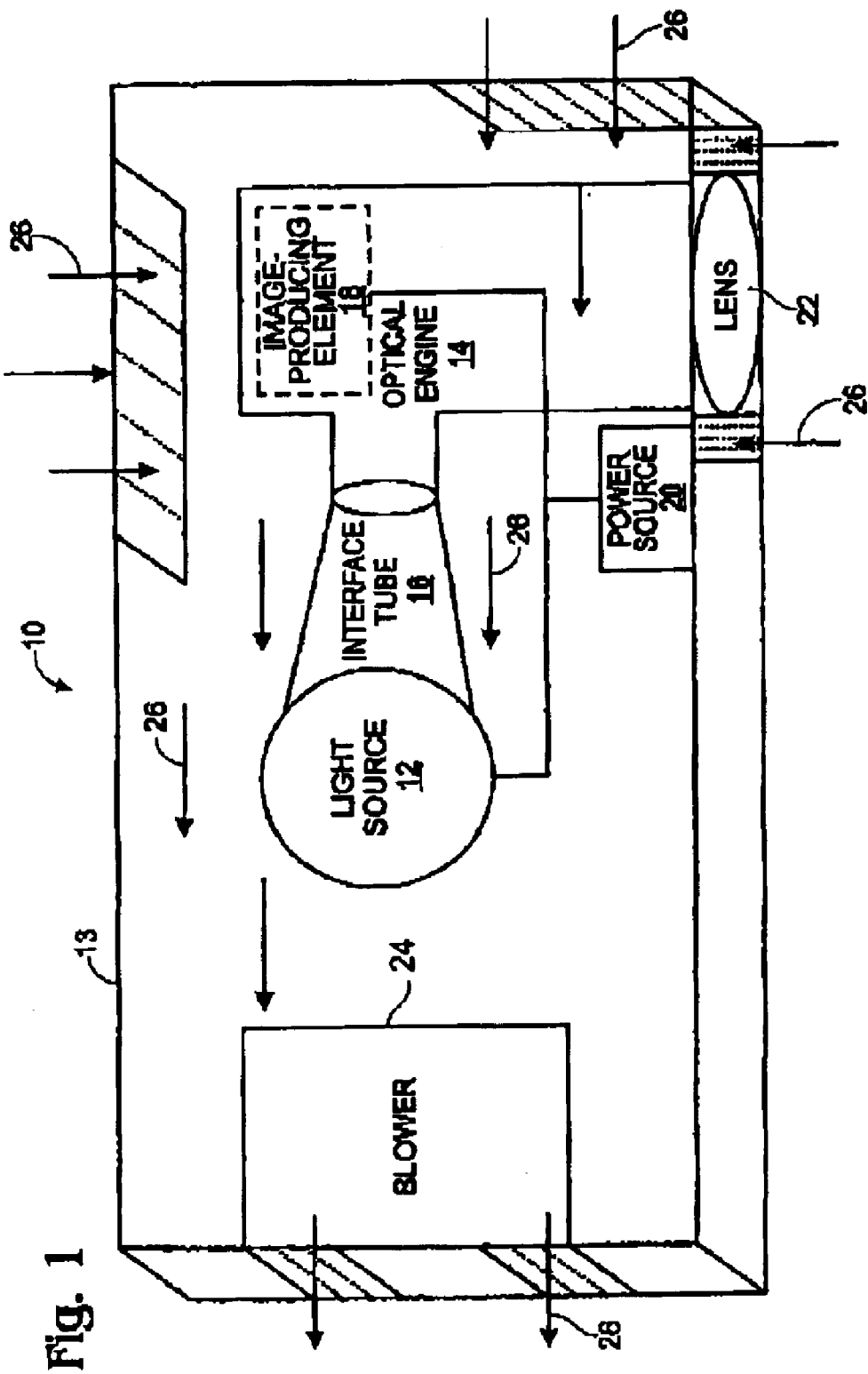
FIG. 1 is a schematic illustration of an embodiment of a projection device.

A projection device or image-generating device 10 is illustrated schematically in FIG. 1. The projection device 10 may be adapted to project an image on a display surface, including, but not limited to, a screen, a wall, or other viewing surface or area. As used herein, a projection device or image-generating device may include any suitable display device or image projector, including, but not limited to, a digital projector, a liquid crystal display (LCD) projector, a digital light processing projector, etc.

In its most basic form, the projection device 10 includes a light source (or lamp) 12 and an optical engine (or image engine) 14 contained within an enclosure, such as a casing 13. The light source 12 may be adapted to produce a beam of light and project the light towards the optical engine 14, which may be configured to generate an image. The light source 12 typically includes a lamp (not shown) positioned within a reflector (not shown) that is configured to direct most of the emitted light along the optical path of the projection device 10. The light source 12 may include any suitable type of lamp. Examples include, but are not limited to, metal halide lamps and ultra-high-pressure (UHP) arc lamps, etc. The emitted light may also pass through one or more filters (not shown), such as an infrared (IR) or ultraviolet (UV) filter, to filter out unwanted parts of the emission spectra of the lamp.

Light produced from the light source 12 may be channeled through an interface tube or spacer 16 to optical engine 14. The optical engine 14 may include filters, color wheels, lenses, mirrors, integrators, condensers, and other optical elements (not shown).

The optical engine 14 may include an image-producing element 18. Any suitable image-producing element may be used. Examples include, but are not limited to, digital micromirror devices (DMD) and LCD panels. The image-producing element 18 may be configured to project light toward one or more mirrors, lenses and/or other optics, such as a projection lens 22, which, in turn, may be configured to reflect light toward a display surface.

The projection device 10 typically includes one or more power sources 20. The power source 20 is typically at least partially disposed on a power source circuit board, and may be linked to the light source 12, the image-producing element 18, and other components, such as a control circuit board within the projection device to provide power to these components.

Operation of light source 12 and other electronic components in projection device 10 may increase the temperature of the projection device 10 during use. If the temperature of the projection device 10 exceeds critical limits, portions of the device may malfunction and/or have a shorter life span. Maintaining temperatures within the device at operating levels thus may prevent the device from malfunctioning and/or increase the lifespan of components and parts. A blower system 24 may thus be provided to circulate ambient air through the projection device and eject circulated air, as depicted by lines 26, thus helping to cool projection device components. The blower system 24 may include a blower portion, such as a fan, wheel, or similar air mover, powered by a blower motor.

Figure 2:
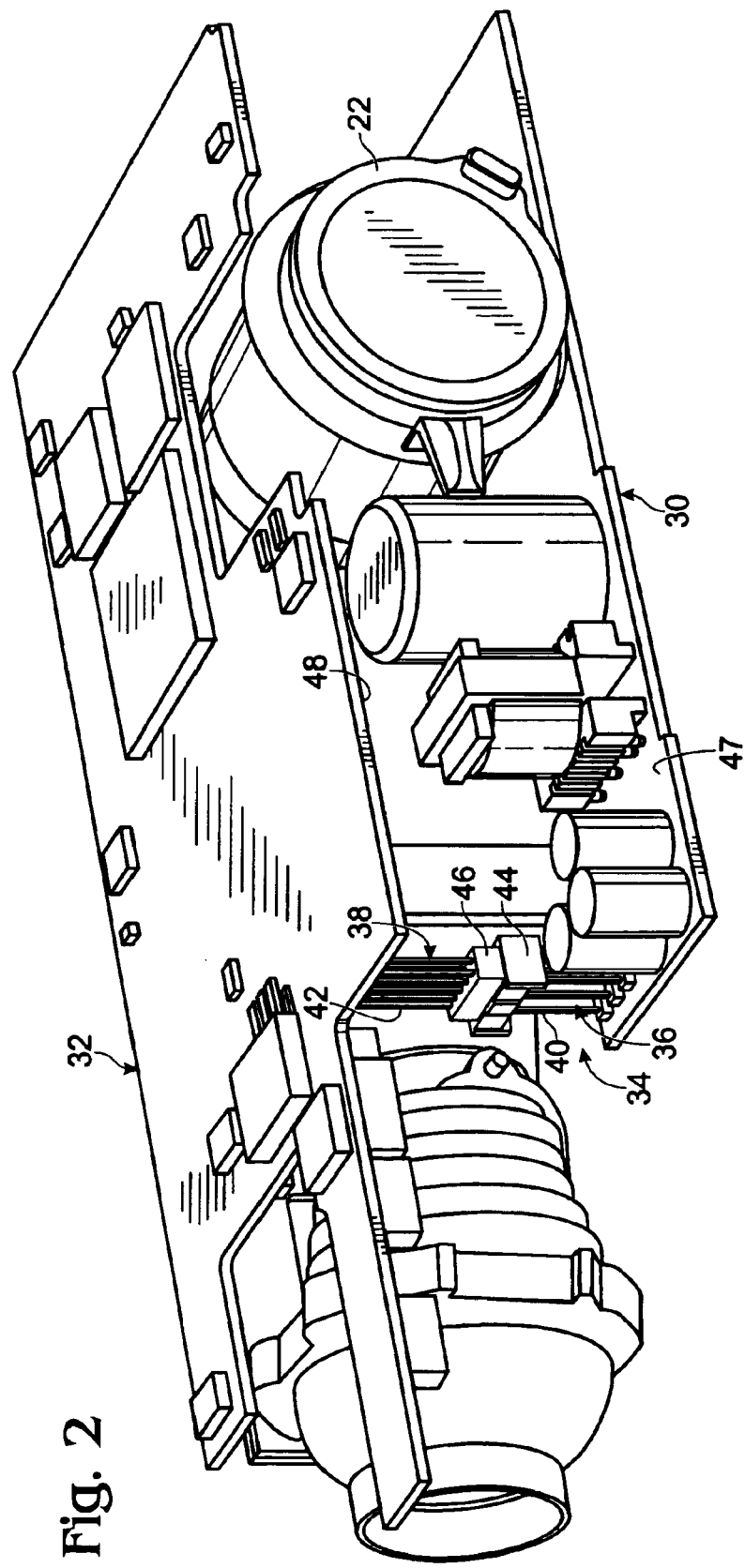
FIG. 2 is an isometric view of an assembly of electrical and optical components of an embodiment of a projection device, showing an embodiment of a board-to-board connector for connecting spaced-apart first and second circuit boards.

FIG. 2 further illustrates various components within an exemplary projection device. As illustrated, the projection device includes a power circuit board 30 and a control circuit board 32. The power board 30 typically is an electronic circuit board configured to regulate DC power within the projection device. The control board 32 includes electrical components configured to control the operation of the projection device 10, such as various logic components. The depicted power board 30 is configured to be positioned adjacent a first side of casing 13, and the depicted control board 32 is configured to be positioned adjacent a second, opposing side of casing 13 in projection device 10, such that the space between the power board 30 and the control board 32 may accommodate electrical and/or optical components, and/or may admit the passage of a flow of cooling air.

The power board 30 is electrically connected to the control board 32 to supply power to the control board 32 via a board-to-board connector 34. In many prior devices, the electrical connections between two spaced-apart circuit boards are achieved through the use of connection devices such as wire harnesses, spanning circuit boards and floating connectors. However, the wire harnesses, spanning circuit boards and floating connectors may be bulky, and thus difficult to physically accommodate within a small-sized projection device. Furthermore, such bulky connection devices may disrupt the airflow through the projection device.

Further, in small devices, the distance between power board 30 and control board 32 may be less than the minimum manufacturable length for wire harnesses, even where the boards are separated as far apart as practical in the device. Manufacturing limitations may cause the wire harness to be bulkier than necessary. Such bulky harnesses may interrupt airflow and disrupt other components within the device. Similarly, stray wires within the wire bundle may disrupt various operating components, such as the color wheel, within the projection device.

Additionally, such connection devices may be difficult to assemble within the confined space of the projection device. For example, the space around the location of the connection may be difficult to access or view during assembly. This may make it difficult to solder or otherwise connect the wires to each of the boards during assembly. Moreover, a partially-blind assembly process may make it difficult to adequately couple the wiring harness to each other, and/or to desired locations on the boards.

Furthermore, the location of the two circuit boards within a projection device may be variable relative to each other due to manufacturing tolerances, thus potentially frustrating the use of precision mating connectors that are often used in spanning circuit boards. Moreover, it may be difficult due to the size of the projection device to allocate space to floating connectors having retention screws that may need to be tightened once the connection between the two boards is made.

In contrast to wire harnesses, spanning circuit boards and floating harnesses, board-to-board connector 34 may be adapted to minimize disruption of other components with the device and airflow within the device, while providing a precise connection of two electronic circuit boards. Further, the board-to-board connector may accommodate variations in the position of the electronic circuit boards relative to each other to accommodate manufacturing tolerances, shocks to the system such as being dropped onto a hard floor, etc.

Figure 4:
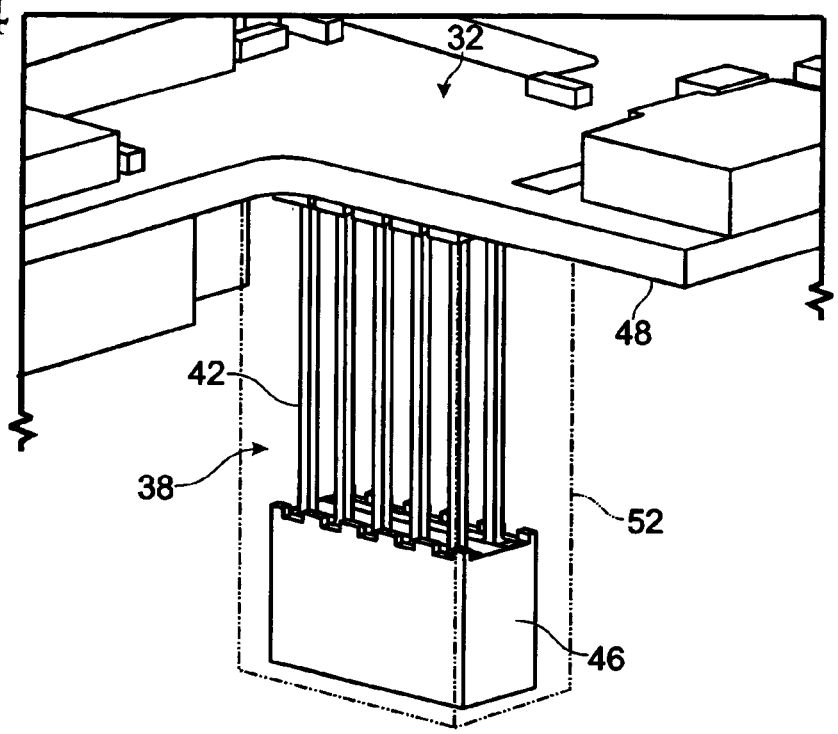
FIG. 4 is a magnified isometric view of a second connector of the embodiment of FIG. 2
Figure 3:
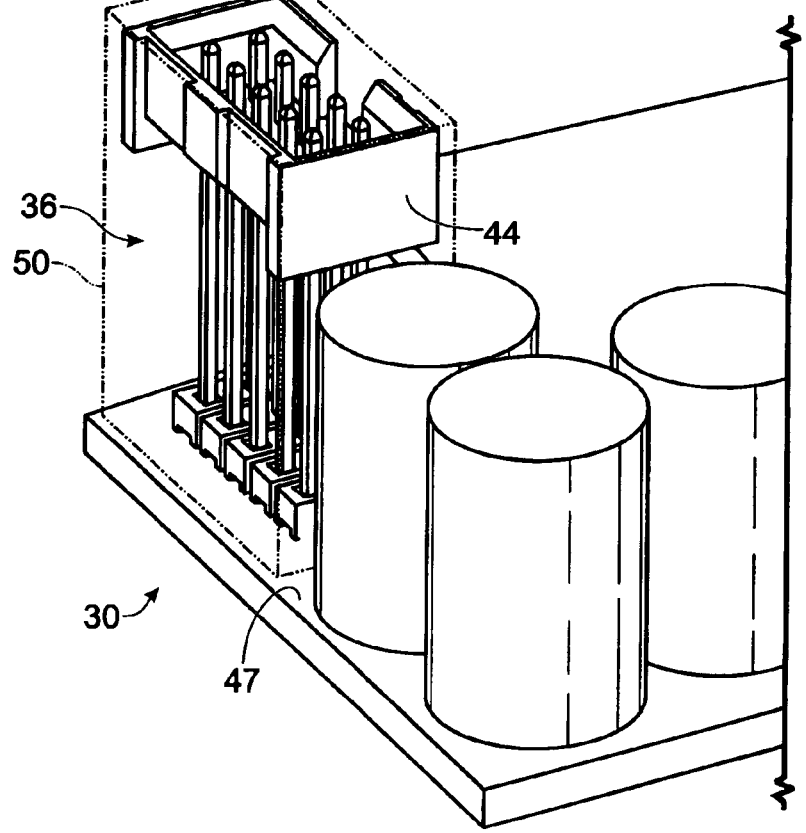
FIG. 3 is a magnified isometric view of a first connector of the embodiment of FIG. 2.

Referring again to FIG. 2, board-to-board connector 34 may include a first connector 36 and a second connector 38. The first connector 36 may be coupled to the power board 30, as shown in more detail in FIG. 3, and the second connector 38 may be coupled to the control board, as shown in more detail in FIG. 4.

The first connector 36 includes a first plurality of leads 40, and the second connector 38 includes a second plurality of leads 42. The first plurality of leads 40 terminate at a first connecting structure 44, and the second plurality of leads 42 terminate in a complementary second connecting structure 46 configured to connect to the first connecting structure 44. Any suitable type of connecting structure may be used for the first connecting structure 44 and the second connecting structure 46. Examples include, but are not limited to, male/female connecting structures.

The plurality of leads 40 of the depicted first connector 36 extend away from the power board 30 in a generally linear manner, and in a direction generally orthogonal to an interior face 47 of the power board 30. Likewise, the plurality of leads 42 of the depicted second connector 38 extends away from the control board 32 in a generally linear manner, and in a direction generally orthogonal to an interior face 48 of the control board 32. In this configuration, the first connecting structure 44 and second connecting structure 46 easily connect to each other where power board 30 and control board 32 are arranged in a generally coplanar relationship. However, it will be appreciated that the first connector 36 and the second connector 38 may extend from the power board 30 and the control board 32, respectively, at any other suitable angles, depending upon the relative orientations and positions of the power board 30 and control board 32 within projection device 10.

The linear configuration of the leads 40 and 42 of first connector 36 and second connector 38, respectively, may occupy less space in the interior of projection device 10 than connectors such as wire harnesses, which typically includes at least some bends. Thus, the use of connector 34 may impede the flow of cooling air through the projection device 10 to a lesser extent than wire harnesses and similar connectors.

The first plurality of leads 40 and second plurality of leads 42 each have sufficient length for the combined length of the plurality of leads 40 and the plurality of leads 42 to bridge the space between the power board 30 and the control board 32 when first connecting structure 44 is coupled with second connecting structure 46. The first and second pluralities of leads 40, 42 may be made of a material rigid enough to support the first and second connecting structures 44, 46 in generally fixed positions when the connecting structures are detached, yet flexible enough to allow the first and second pluralities of leads 40, 42 to absorb variations in positions due to thermal expansion/contraction, manufacturing tolerances, etc. It should be noted that although each connector set in the illustrated embodiments include ten leads, either more or fewer leads may be used.

The first and second pluralities of leads 40, 42 may be further supported through an alignment shroud. The alignment shroud may guide the connection of the power board to the control board, and also may provide additional insulation and protection to first and second connectors 36, 38. The alignment shroud may include a first shroud segment, shown at 50 in FIG. 3, that partially or fully encloses first connector 36, and a second shroud segment, shown at 52 in FIG. 4, that partially or fully encloses second connector 38. The first and second shroud segments 50, 52 may be configured to attach together, for example, via a snap connection, when first connector 36 and second connector 38 are coupled together. Such alignment shrouds may help to ensure precise alignment of the first connecting structure 44 with the second connecting structure 46 during assembly of projection device 10. Such alignment shrouds may further allow for positive engagement of the first and second connecting structures 44, 46 regardless of the ease/difficulty of viewing the connection of the connecting structures 44, 46 during assembly.

In some embodiments, the use of board-to-board connector 34 to join two spaced-apart circuit boards enables the first connector 36 and second connector 38 to be easily connected even where the connection process is a blind or semi-blind process. For example, after placing the power board 30 in a desired location and after installing any other desired projector components, the control board 32 may be positioned over the power board 30 such that the second connecting structure 46 is positioned directly opposite the first connecting structure 44. Then, second and first connecting structure 46 and 44 may be joined simply by pushing the control board 32 toward the power board 30. Therefore, first connector 36 may be coupled to second connector 38 in a fast and efficient manner, even where the connectors are located in areas that are partially or totally obscured by other components, or difficult to access. Furthermore, as mentioned above, the first and second pluralities of leads 40, 42 may be configured to have sufficient flexibility to accommodate positional variation of circuit boards of different devices during the assembly process. For example, once the alignment shrouds are interlocked, the leads may adapt and bend in accordance with the positions of the connected boards.

Figure 5:
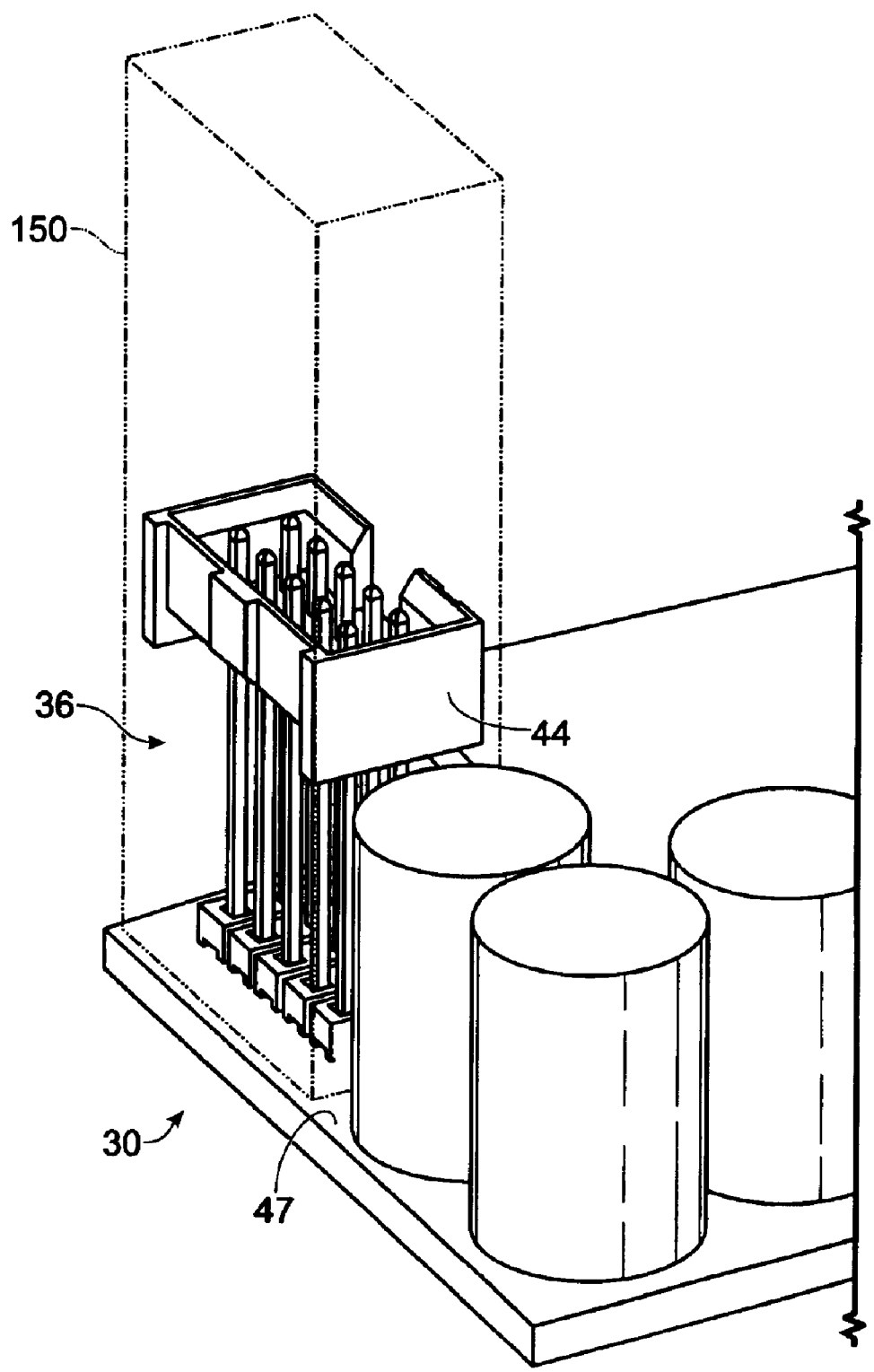
FIG. 5 is a magnified isometric view of the first connector of the embodiment of FIG. 2, showing a schematic outline of an alternate shroud configuration.

FIG. 5 shows an alternate shroud configuration, generally at 150. Instead of having two separate shroud portions, such as the shroud shown in FIGS. 3–4, shroud 150 has a single-piece construction configured to hold both first connector 36 and second connector 38 within its interior. Shroud 150 may help to aid the alignment of the first connector 36 with the second connector 38 during projector device assembly. For example, the second connector 38 may be simply inserted into shroud 150 as the second connector 38 is lowered toward the first connector 36. Shroud 150 then may function to guide the second connector 38 into correct alignment with the first connector 36, even in situations in which the second connector 38 and first connector 36 are in blind locations within projection device 10.

The depicted connector 34 may occupy a minimum footprint within the projection device compared to other connectors. The compactness of connector 34 enables reduction of the overall size of the projection device 10 to sizes that may be difficult to achieve using ribbons or wire harnesses, spanning circuit boards and/or floating connectors. Furthermore, the use of connector 34 may allow separate circuit boards to be placed at spaced-apart locations in a device to make room for other components between the boards. For example, in the depicted embodiment, the separation of power board 30 and control board 32 allows various optical and/or electrical components, such as projection lens 22, to be located between the boards. Additionally, the configuration of the board-to-board connector may offer less of an impediment to a flow of cooling air through the projection device than the other types of connectors discussed above.

Although the present exemplary embodiments illustrate the use of a board-to board connector in a projection device, it should be appreciated that the board-to-board connector described herein may be used in any suitable device requiring compact and precise alignment of two circuit boards. Furthermore, although the present disclosure includes specific embodiments, specific embodiments are not to be considered in a limiting sense, because numerous variations are possible. The subject matter of the present disclosure includes all novel and nonobvious combinations and subcombinations of the various elements, features, functions, and/or properties disclosed herein. The following claims particularly point out certain combinations and subcombinations regarded as novel and nonobvious. These claims may refer to "an" element or "a first" element or the equivalent thereof. Such claims should be understood to include incorporation of one or more such elements, neither requiring nor excluding two or more such elements. Other combinations and subcombinations of features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

What is claimed is:

1. A projection device, comprising:
   a first projection device circuit board;
   a second projection device circuit board positioned in a spaced-apart relation to the first circuit board;
   an optical component disposed between the first circuit board and the second circuit board;
   a first connector extending from the first circuit board generally linearly toward the second circuit board; and
   a second connector extending from the second circuit board generally linearly toward the first circuit board, wherein the first connector and the second connector are coupled together to form an electrically conductive pathway between the first circuit board and the second circuit board.

2. The projection device of claim 1, further comprising a casing having opposing interior sides, wherein first board is located adjacent one opposing interior side of the casing and second board is located adjacent the other opposing interior side of the casing.

3. The projection device of claim 1, wherein the first connector has a first plurality of leads connected at one end to the first circuit board and at another end to a first connecting structure, and wherein the second connector has a second plurality of leads connected at one end to second circuit board and at another end to a second connecting structure, and wherein the second connecting structure is coupled to the first connecting structure.

4. The projection device of claim 3, wherein the first plurality of leads are formed from a flexible material capable of supporting the first connecting structure in a generally fixed position when disconnected from the second connecting structure, and capable of flexing under stress when connected to the second connecting structure.

5. The projection device of claim 1, further comprising an airflow passage between the first circuit board and the second circuit board, and wherein the first connector and second connector bridge the airflow passage.

6. The projection device of claim 1, further comprising a shroud at least partially covering at least one of the first connector and the second connector.

7. The projection device of claim 6 wherein the shroud is a single-piece construction having a distal end extending past the distal end of the first or second connector so as to span a substantial portion of the distance between the first circuit board and the second circuit board when the first and second circuit boards are connected.

8. A projection device, comprising:
   a casing having an interior;
   a first projection device circuit board disposed within the interior;
   a first connector extending away from the first circuit board, wherein the first connector includes a plurality of first leads connected at one end to the first circuit board and connected at another end to a first connecting structure;
   a second projection device circuit board disposed within the interior, wherein the second circuit board has a spaced-apart relation to the first circuit board;
   a second connector extending away from the second circuit board, wherein the second connector includes a plurality of second leads connected at one end to the second circuit board and connected at another end to a second connecting structure, and
   an optical component disposed between the first circuit board and the second circuit board;
   wherein the first connecting structure and second connecting structure are coupled together, and wherein the first leads are configured to support the first connecting structure in a generally fixed position relative to the first circuit board and the second leads are configured to support the second connecting structure in a generally fixed position relative to the second circuit board when the first and second connecting structures are disconnected.

9. The projection device of claim 8, wherein the first circuit board is a power supply board, and wherein the second circuit board is a logic control board.

10. The projection device of claim 8, further comprising an airflow passage between the first circuit board and the second circuit board, and wherein the first connector and second connector bridge the airflow passage.

11. The projection device of claim 8, wherein the first circuit board and the second circuit board are generally coplanar, wherein the first connector extends away from the first circuit board in a direction generally orthogonal to a face of the first circuit board, and wherein the second connector extends away from the second circuit board in a direction generally orthogonal to a face of the second circuit board.

12. The projection device of claim 8, further comprising a shroud that at least partially surrounds at least one of the first connecting structure and the second connecting structure.

13. The projection device of claim 12 wherein the shroud is a single-piece construction having a distal end extending past the distal end of the first or second connector so as to span a substantial portion of the distance between the first circuit board and the second circuit board when the first and second circuit boards are connected.

14. A projection device, comprising:
   a first circuit board;
   a first electrical connector extending from the first circuit board in a direction generally orthogonal to the first circuit board;
   a second circuit board disposed in a spaced-apart, generally coplanar relationship to the first circuit board;
   a second electrical connector extending from the second circuit board in a direction generally orthogonal to the second circuit board, wherein the second connector is coupled to the first connector; and
   an optical system disposed between the first circuit board and the second circuit board.

15. The projection device of claim 14, wherein the first electrical connector extends away from the first circuit board in a generally linear configuration, and wherein the second electrical connector extends away from the second circuit board in a generally linear configuration.

16. The projection device of claim 14, wherein the first connector has a first plurality of leads connected at one end to the first circuit board and at another end to a first connecting structure, and wherein the second connector has a second plurality of leads connected at one end to second circuit board and at another end to a second connecting structure coupled to the first connecting structure.

17. The projection device of claim 16, wherein the first plurality of leads are formed from a flexible material capable of supporting the first connecting structure in a generally fixed position when disconnected from the second connecting structure, and capable of flexing under stress when connected to the second connecting structure.

18. The projection device of claim 14, further comprising an airflow passage between the first circuit board and the second circuit board, and wherein the first connector and second connector bridge the airflow passage.

19. A method of assembling a projection device, wherein the projection device includes a casing, a first projection device circuit board having a first connector extending therefrom, and a second projection device circuit board having a second connector extending therefrom, the method comprising:
   positioning the first circuit board;
   positioning the second circuit board in a spaced relation to the first circuit board;
   positioning an optical element between first circuit board and second circuit board; and
   moving the second circuit board toward the first circuit board to connect the first connector to the second connector, thereby electrically connecting the first connector to the second connector.

20. The method of claim 19, wherein positioning the second circuit board includes positioning the second circuit board such that a connecting structure on the second connector opposes a connecting structure on the first connector.

21. The method of claim 19, wherein positioning the second circuit board includes positioning the second circuit board in a generally coplanar relation to the first circuit board.

22. The method of claim 19, wherein the first connector has a first plurality of leads connected at one end to the first circuit board and at another end to a first connecting structure, and wherein the second connector has a second plurality of leads connected at one end to the second circuit board and at another end to a second connecting structure configured to be coupled to the first connecting structure.

23. The method of claim 22, wherein the first plurality of leads are formed from a flexible material capable of supporting the first connecting structure in a generally fixed position when disconnected from the second connecting structure, and capable of flexing under stress when connected to the second connecting structure.

24. The method claim 19 wherein the projection device further comprises a shroud at least partially covering the first connector, the shroud being a single piece construction having a distal end extending past the distal end of the first connector such that the shroud spans a substantial portion of the distance between the first circuit board and the second circuit board when the first and second circuit boards are connected, the method further comprising:
   inserting the second connector into the shroud so as to allow the shroud the guide the second connector into contact with the first connector.

* * * * *

UNITED STATES PATENT AND TRADEMARK OFFICE
CERTIFICATE OF CORRECTION

| | | |
|---|---|---|
| PATENT NO. | : 6,939,146 B2 | |
| APPLICATION NO. | : 10/860558 | |
| DATED | : September 6, 2005 | |
| INVENTOR(S) | : Tony Rogers et al. | |

It is certified that error appears in the above-identified patent and that said Letters Patent is hereby corrected as shown below:

On Title Page, Item (75) Col. 1 insert the following inventor: --Wayne Robson, Wilsonville, OR (US)--

In Column 8, line 12, delete "between first" and insert --between the first-- therefor.

Signed and Sealed this

Nineteenth Day of September, 2006

JON W. DUDAS
*Director of the United States Patent and Trademark Office*